United States Patent [19]

Wing et al.

[11] 4,314,174
[45] Feb. 2, 1982

[54] PIEZOELECTRIC TRANSDUCER DRIVE HAVING TEMPERATURE COMPENSATION

[75] Inventors: Thomas Wing; Lloyd M. Germain, both of Woodland Hills, Calif.

[73] Assignee: Litton Systems, Inc., Beverly Hills, Calif.

[21] Appl. No.: 133,730

[22] Filed: Mar. 25, 1980

[51] Int. Cl.³ .................. H01L 41/08; G01B 9/02
[52] U.S. Cl. ................. 310/315; 310/321; 310/316; 310/346; 372/18
[58] Field of Search .............. 310/315–317, 310/321, 346, 330–332; 356/350; 330/272, 273; 331/94.5 ML, 94.5 C, 94.5 D, 65, 70, 158

[56] References Cited

U.S. PATENT DOCUMENTS

| | | | |
|---|---|---|---|
| 2,951,208 | 8/1960 | Barton | 330/273 |
| 3,555,453 | 1/1971 | Littauer | 310/321 X |
| 3,714,475 | 1/1973 | Baker, Jr. | 310/321 |
| 4,099,876 | 7/1978 | Dorsman | 310/317 |
| 4,113,387 | 9/1978 | Shutt | 310/332 X |
| 4,115,004 | 9/1978 | Hutchings | 331/94.5 ML |

*Primary Examiner*—Mark O. Budd
*Attorney, Agent, or Firm*—Roy L. Brown

[57] ABSTRACT

A piezoelectric transducer drive for use within a ring laser gyro is shown wherein a resistive element is combined in a negative feedback loop with a second resistive element to provide a feedback signal which is constant with variations in the transducer material and linear with temperature change. The feedback signal is amplified and applied to a comparator whose output is modulated with an AC signal and applied to a power amplifier that drives the piezoelectric transducer for controlling the displacement thereof uniformly over a wide temperature range.

9 Claims, 4 Drawing Figures

PIEZOELECTRIC TRANSDUCER DRIVE HAVING TEMPERATURE COMPENSATION

BACKGROUND OF THE INVENTION

This invention relates to a piezoelectric transducer drive having temperature compensation and, more particularly, to a piezoelectric transducer which drives the dither mechanism of a ring laser gyro having a temperature compensated feedback circuit for controlling the amplitude of the displacement caused by the piezoelectric transducer drive.

The essence of a ring laser gyro is that two light waves, circulating in opposite directions around the same closed path, undergo non-reciprocal phase shifts when the path is rotated. Since the path is a laser resonant cavity, the phase shifts produce optical frequency differences between the two waves. The two frequencies heterodyne at a common photodetector, giving rise to a beat frequency directly proportional to the angular rotation rate. When the angular rotation rate of a simple, unbiased ring laser is reduced to some minimum value, the frequency split between the clockwise and counterclockwise modes of oppositely directed light waves decreases so that the separate oscillations are no longer sustained. The modes of oppositely directed light degenerate and lock at the same frequency. This degeneration is caused by the backscatter radiation which is created as the light waves are reflected from the various mirrors within the closed path which forms the ring laser gyro.

In prior art arrangements, one method of eliminating mode locking at lower angular rotation rates is to introduce mechanical dithering. Such an arrangement is shown in U.S. Pat. No. 4,115,004 entitled "Counterbalanced Oscillating Ring Laser Gyro" by Thomas J. Hutchings and Virgil E. Sanders which issued Sept. 19, 1978 and is assigned to Litton Systems, Inc.

The device shown in the Hutchings et al. U.S. Pat. No. 4,115,004 may be driven by a torque motor as described therein or by a piezoelectric transducer drive. When a piezoelectric drive is utilized, the piezoelectric crystals which form the transducer tend to produce a variable displacement or deflection as a function of the voltage applied across them. This variation is first caused by differences created within each crystal during its manufacturing. A second cause is the fact that the displacement of a piezoelectric crystal is nonlinear with respect to temperature.

In prior art circuits, it is known to utilize one semiconductor material which is affected by temperature within the circuit to offset the effects of temperature on another semiconductor material used therein. See U.S. Pat. No. 2,951,208 entitled "Temperature Controlled Semiconductor Bias Circuit" by Loy E. Barton which issued Aug. 30, 1960 and is assigned to the Radio Corporation of America. The present invention carries this concept further by utilizing a feedback circuit which includes electrical elements arranged to offset the effects of temperature upon an electro-mechanical drive mechanism while controlling the voltage applied across the mechanism.

SUMMARY OF THE INVENTION

The utilization of piezoelectric transducers to drive the dither mechanism of a ring laser gyro is known in the art. As described above, it is necessary to dither a ring laser gyro in order to prevent the oppositely directed light waves from mode locking. This locking is caused when the angular displacement rate of the ring laser gyro approaches a minimum value and, due to backscattering, the clockwise and counterclockwise rotating light waves appear to have the same frequency and therefore lock at that frequency rendering the output of the ring laser gyro useless. To prevent this, the ring laser may be mounted upon a dither mechanism comprised of a plurality of flexure spring elements. An example of such a dither mechanism is described in the Hutchings et al. U.S. Pat. No. 4,115,004. The dither mechanism may be driven by applying a voltage across piezoelectric crystals which are mounted upon the surfaces of the spring elements.

While piezoelectric crystals may be used to drive a dither mechanism, they may also be use as feedback elements. As a typical ring laser gyro is subjected to extreme temperature conditions, such as $-55$ to $+55$ degrees centigrade, it is desirable to provide crystals which are insensitive to such variations. However, piezoelectric crystals are unpredictable and nonlinear with temperature change. Further, the manufacturing technique used to form such crystals is not controlled to the extent required to create a predictable output of such crystals from one batch to another. As a result, utilization of piezoelectric crystals for either drive or feedback functions creates inherent temperature nonlinearity while use of piezoelectric crystals for both functions compounds the problem.

The present invention seeks to overcome this problem by utilizing the piezoelectric crystals solely for the purpose of driving a dither mechanism within a ring laser gyro. The feedback elements, which may be constructed from piezoelectric material, are replaced with resistive elements constructed from materials that are predictable and linear with temperature change. It is recognized that the metal which forms the flexure spring elements within the dither mechanism is linearly displaced over a wide temperature range. By bonding a resistive element to the spring element, it is possible to begin to obtain a feedback signal which is linear over the temperature range. Next, a second temperature responsive resistive element may be utilized to provide compensation over the desired range of temperatures. By combining the two resistive elements in a negative feedback loop, it is possible to characterize a feedback signal to be linear and constant with respect to temperature change over a wide range of temperatures.

A power drive circuit is connected to drive the piezoelectric transducer having a feedback loop that incorporates the combination of the resistive element and the temperature responsive resistive element. These elements are connected to a comparator amplifier circuit within the feedback loop which characterizes the feedback signal applied to a power amplifier.

Through this arrangement, a voltage is applied across the nonlinear piezoelectric driving elements which is sensed by the feedback circuit. The output of the feedback circuit is characterized to be linear and constant over a wide temperature range through the combination of the resistive elements. As the flexure of the spring elements, driven by the piezoelectric element, reaches a predetermined level, as sensed by the first resistive element. The comparator amplifier within the feedback circuit compares the signal to a D.C. signal and applies a correcting signal to the output of a power amplifier for controlling the amplitude of the displacement caused by the piezoelectric drive elements. The first resistive element and the second temperature responsive resistive element have been combined in a bridge circuit to provide a constant feedback signal with respect to temperature variations.

Accordingly, it is an object of the present invention to provide an improved piezoelectric transducer drive for a ring laser gyro that has a constant, linear response over a wide range of temperatures.

It is another object of this invention to provide a mechanical dithering mechanism with a piezoelectric transducer drive which linearly controls the amplitude of the displacement of that system.

DETAILED DESCRIPTION OF THE PREFERRED EMBODIMENT

Figure 1:
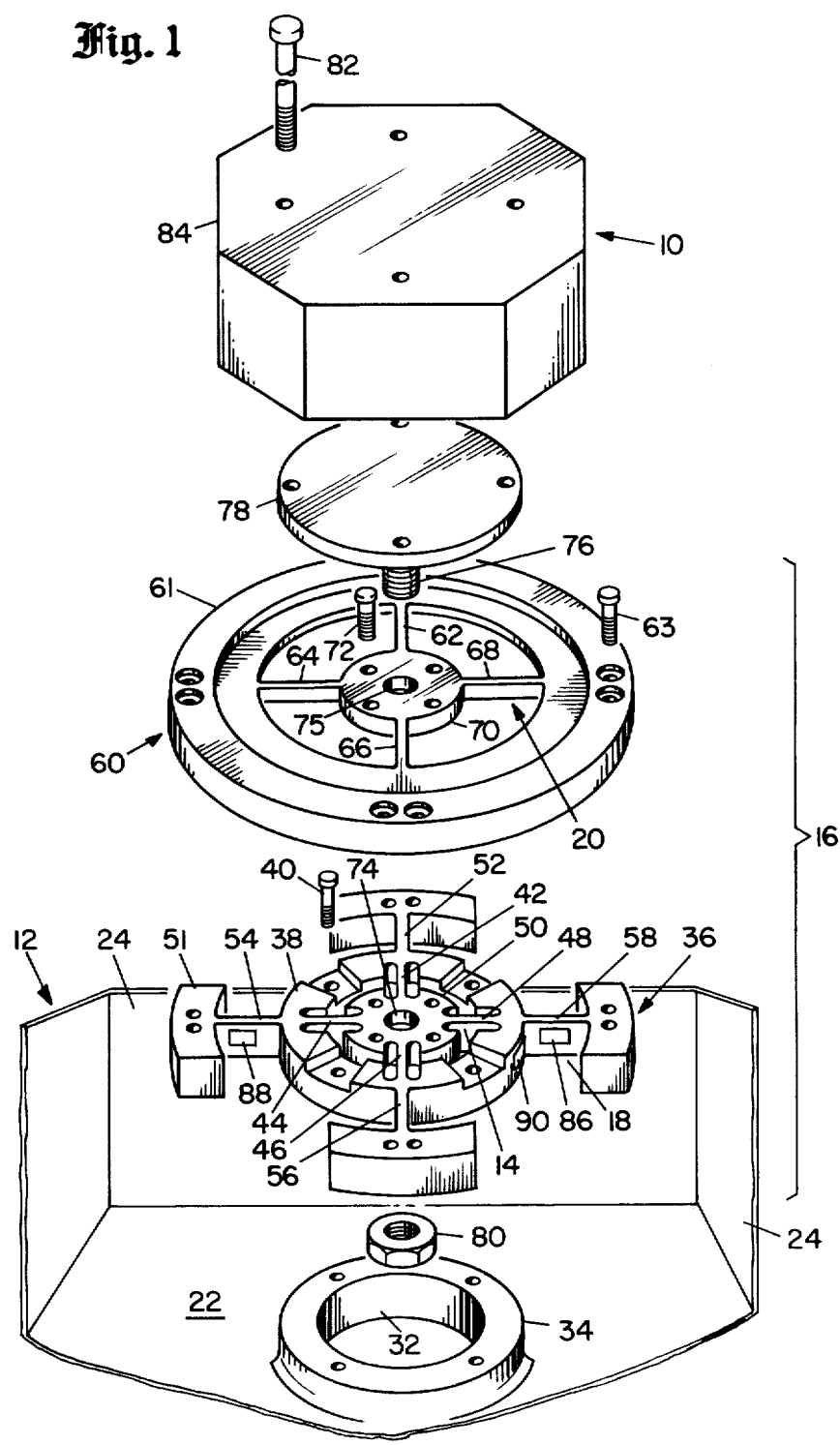
FIG. 1 is an exploded view showing a ring laser gyro that incorporates a mechanical dithering system driven by piezoelectric transducers.

FIG. 1 illustrates a dither mechanism utilizing a three spring system which is further described in a patent application by Fred McNair and Thomas M. Wirt, entitled "Improved Laser Gyro Dither Mechanism" which was filed on Jan. 11, 1980 as Ser. No. 111,154 and is assigned to the same assignee as the present invention. The three spring system shown in FIG. 1 into which the present invention is incorporated is utilized to dither a ring laser gyro 10. A two spring system in which the present invention may also be utilized is shown in the Hutchings et al. U.S. Pat. No. 4,115,004. Whether the dither mechanism utilizes a single set of springs, a dual spring system, or three or more spring systems is of little consequence when describing the preferred embodiment of the present invention.

As shown in FIG. 1, the ring laser gyro 10 is mounted within a case 12 by a first spring system 14. The case 12 is also attached to a counterweight 16 by a second spring system 18 while the counterweight 16 in turn connects to the gyro 10 through a third spring system 20.

Case 12 is formed from a flat rectangularly-shaped base 22 having sidewalls 24 that form a cavity which is closed and sealed by a rectangular cover, not shown. Rectangular base 22 is provided with an aperture 32 surrounded by a toroidally-shaped mounting collar 34. Mounted upon the collar 34 is a first flexure plate 36 which incorporates the first and second spring systems 14 and 18, respectively.

The flexure plate 36 consists of a first middle toroidal mounting ring 38 which is coaxially arranged with the collar 34 and attached thereto by a plurality of screws 40; whereby, the middle ring 38 becomes part of the case 12. The first spring system 14 is comprised of four radially, inwardly directed flexure spring elements 42, 44, 46, and 48 which attach the first middle toroidal ring 38 to an inner mounting hub 50 to which is mounted the gyro 10. The first middle toroidal ring is also attached to an outer toroidal ring 51 by the second spring system 18 formed from four spring elements 52, 54, 56, and 58 which radiate from the first toroidal ring 38 outwardly toward the outer segmented toroidal ring 51. The outer toroidal ring 51 forms part of the counterweight 16 as will be described below.

Mounted to the first flexure plate 36 is a second flexure plate 60 having an outer toroidal ring 61 which is coaxially arranged with the outer toroidal ring 51 of the first flexure plate. The outer toroidal ring 61 is connected via the third spring system 20 formed by radially, inwardly directed flexure spring elements 62, 64, 66, and 68 to an inner hub 60 which is coaxially arranged with the inner hub 50 of the first flexure plate 36.

The outer toroidal ring 61 of the second flexure plate 60 forms the second mass of the counterweight 16. This ring 61 is attached to the outer toroidal ring 51 by a plurality of screws 63. Each flexure plate 63 and 60 has a centrally located aperture 74 and 75, respectively, through which passes a flexure stud 76 which extends from the lower surface of a gyro mounting platform 78. The outermost end of the stud 76 is threaded to receive a hex nut 80 which, in combination with screws 63 and 72, unite the first and second flexure plates 36 and 60 into a suspension assembly.

Mounted upon the gyro mounting plate 78, as by screws 82, is the gyro 10 which may be formed within a body 84, constructed with four passageways, not shown, arranged within the body 82 to form a closed rectangular laser path. The passageways are sealed to retain a gas mixture consisting of approximately 90% helium and 10% neon at a vacuum of approximately 3 torr, it being understood that atmospheric pressure is approximately 760 torrs.

Figure 2:
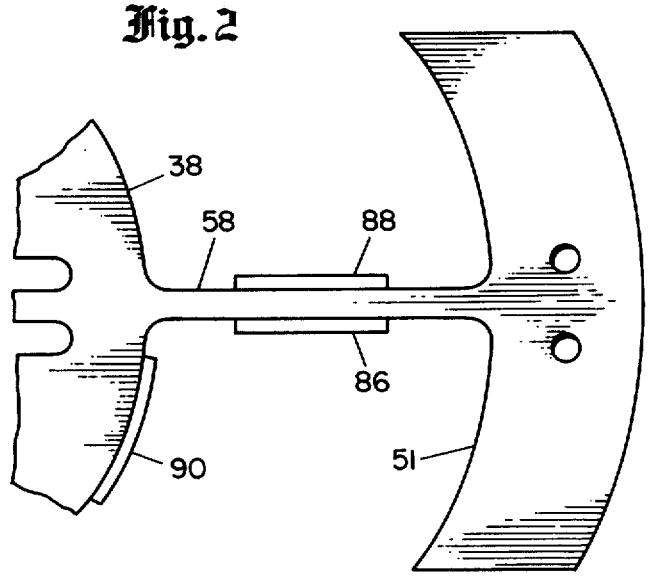
FIG. 2 is a top plane view showing a single flexure spring element having a piezoelectric element, resistive element and second temperature responsive resistive element mounted thereon.

Referring now to FIG. 2, a plane view of a typical flexure spring element such as element 58 is shown. Attached to one flat, wide side surface of the thin flexure web which forms spring element 58 is a piezoelectric crystal element 86. It will be understood that the piezoelectric element 86 may be attached by any of the well known bonding techniques and that wires, not shown, extend from that element. On the obverse side of the spring element 58 a resistive element 88, such as a strain gauge is attached, as by bonding. Again, the wires are not shown. In the preferred embodiment, the strain gauge is a positive linear strain gauge. Finally, a temperature responsive resistive element 90 is attached to the middle toroidal ring 38. The temperature responsive element may be a negative, positive or zero thermistor, NPO thermister, which is attached by bonding or a second strain gauge. In the preferred embodiment the temperature responsive element is a positive linear strain gauge of the same material as resistive element 88.

The piezoelectric transducer drive formed from the piezoelectric element 86, resistive element 88 and second resistive element 90 may be attached to either the first spring system 14 or the second spring system 18. It will be understood that the particular spring system to which the transducer drive is attached is of little consequence. However, it should be noted that each flexure spring 52, 54, 56 and 58, for example, requires a piezoelectric driving element, while but one spring, such as spring 54 in FIG. 1, requires a resistive element 88. Further, only one temperature responsive element 90 is required. The reason for this is that each web must be driven by a driving element 86 while only one feedback element 88 is required. In fact, if four feedback elements were used an anomaly might be created which would be detrimental to the drive system. While the temperature resistive element 90 may be mounted anywhere, it is desirable to mount it upon the main frame or, in the embodiment shown, upon the toroidal ring 38 which is attached to the case 12. Through this arrangement the temperature resistive element is not subjected to strain caused by the driving of the flexure spring elements.

Figure 3:
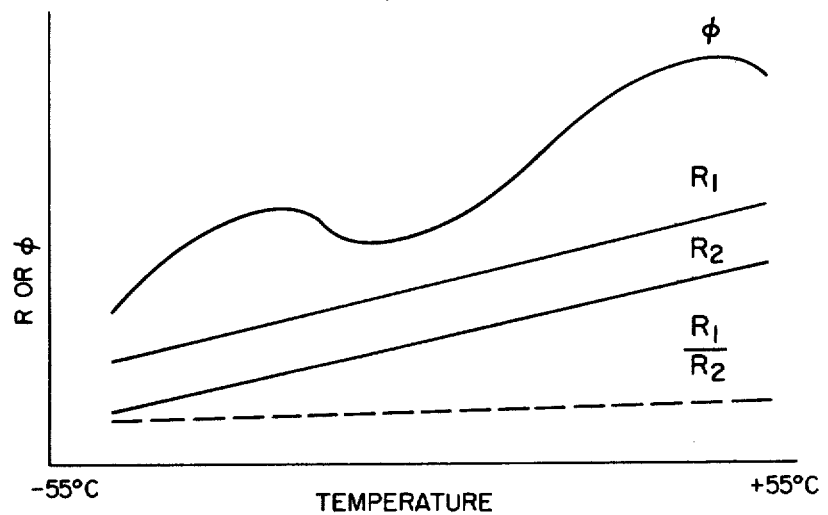
FIG. 3 is a curve showing a typical output of a piezoelectric element, a resistive element and a temperature responsive resistive element.

In FIG. 3 it will be seen that the displacement of the piezoelectric element 86, illustrated by the simple $\phi$, does not follow a linear curve with respect to temperature T. In the preferred embodiment, the output resistance of the resistive element 88, $R_1$, has a tendency to increase with temperature while the output resistance of the temperature responsive element 90, $R_2$, also has a tendency to increase with increasing temperature. The ratio of these two signals is thus a constant and a linear function with respect to temperature as shown at $R_1/R_2$.

Figure 4:
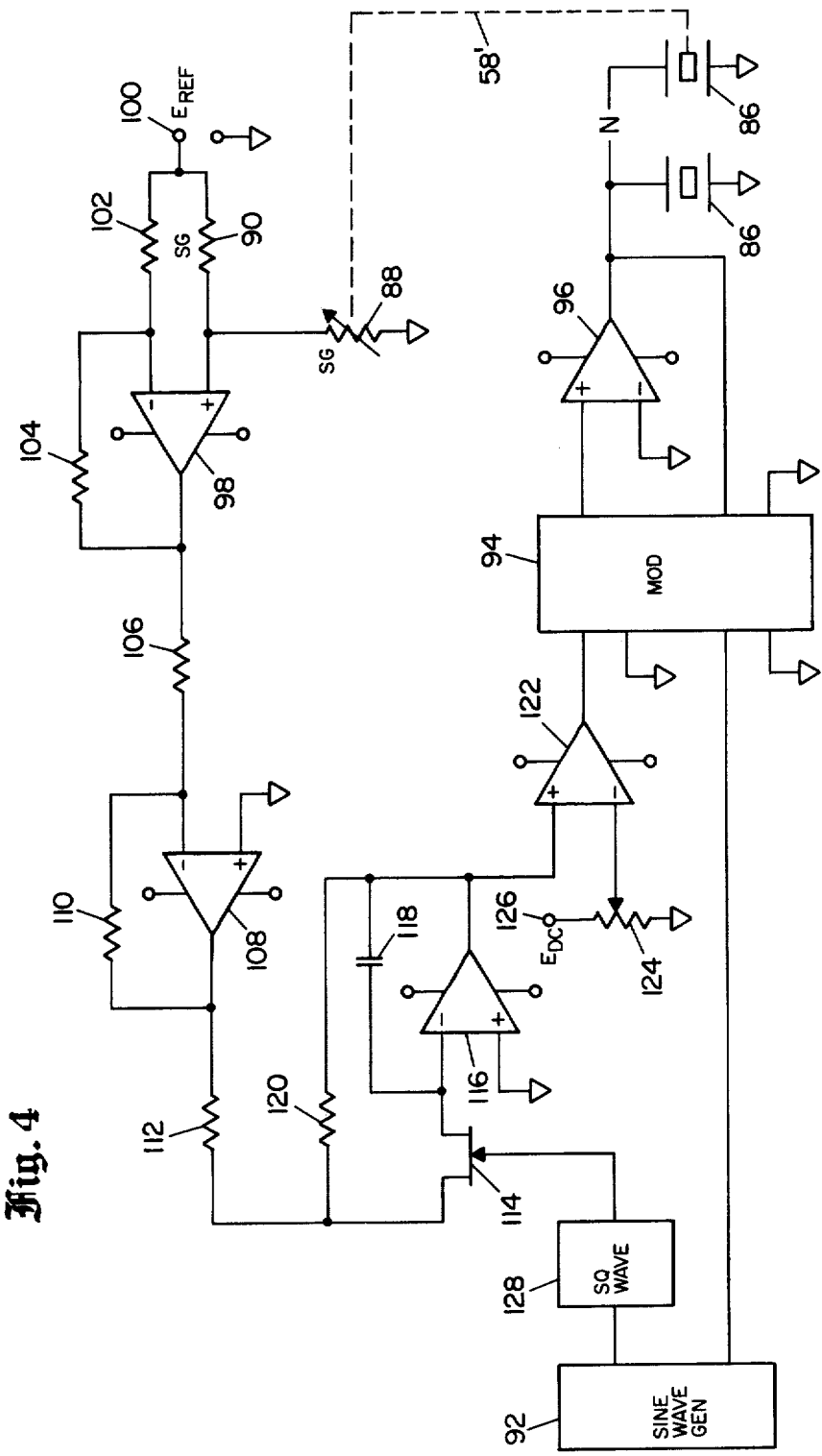
FIG. 4 is a schematic diagram showing a power drive circuit for driving the piezoelectric transducer.

A typical schematic in which the piezoelectric transducer drive of the present invention may be utilized is shown in FIG. 4. A drive signal in the form of an AC signal is generated by a sine wave generator 92 whose signal is applied to a modulator circuit 94. The output of modulator circuit 94 is connected to the positive input port of a power amplifier 96 having its second negative input port connected to ground and its output connected to one terminal of each piezoelectric transducer 86. As shown in FIG. 4, any number "N" of transducers may be utilized for driving the dither mechanism depending upon the number of springs within the system desired. The resistive element 86 located on the obverse face of the web 58 is connected to the piezoelectric transducer 86 through a mechanical linkage formed by the web as shown by the broken line 58'. While one terminal of the resistive element 88 is connected to ground, the second terminal thereof connects to the positive input port of a temperature tracking amplifier 98. The positive input port is also connected through the second temperature responsive resistive element 90 to a source of reference potential 100. The reference potential 100 connects through a resistor 102 to the negative input port of the amplifier 98. The negative port then connects via a resistor 104 to the output of amplifier 98 which is connected through a resistor 106 to the negative input port of a gain amplifier 108. The positive port of gain amplifier 108 is connected to ground to complete the input bridge circuit which includes resistive element 88, temperature responsive element 90 and resistors 102, 104 and 106. A feedback resistor 110 connects between the negative input port of gain amplifier 108 and its output which is then connected through a resistive element 112 to the source of an FET switch 114. The drain of the FET switch is connected to the negative input port of an amplifier 116 which is designed to act as an AC to DC converter. The positive input port of the amplifier 116 is connected to ground. The output of amplifier 116 connects via a feedback capacitor 118 to the drain terminal of the FET switch 114 while a feedback resistor 120 connects from the output terminal of amplifier 16 to the source of the FET switch 114.

The output of amplifier 116 is also connected to the positive input port of a comparator amplifier 122 whose negative input port is connected to a variable terminal of a potentiometer 124. The fixed terminals of the potentiometer 124 are connected across a source of DC potential 126. The output of the comparator 122 is connected to the modulator 94 to complete the negative feedback loop. The output of the sine wave generator 92 is applied to a square wave generator 128 and then to the gate of the FET switch 114 to complete the circuit.

In operation, the DC signal from the comparator 122 is modulated with the AC signal from the sine wave generator 92 at the modulator 94. This modulated signal is applied to the power amplifier 96 and then to the piezoelectric transducer crystals 86. The voltage across the crystals 86 causes a flexure of spring 58 which is senced by the strain gauge 88 for varying the voltage applied to the temperature tracking amplifier 98. It will be seen that the resistors 102 and 104 are arranged in a bridge configuration with the resistive element 88 and 90. If there is a zero flexure on resistive element 88 the potential at the positive input port of amplifier 98 will remain constant. As temperature varies, the effect of temperature upon the resistive element 88 will be counterbalanced by the effect of that temperature upon the temperature sensitive element 90. As seen in FIG. 3, the ratio of the two resistances remains constant so that the potential at the positive input part of amplifier 98 is not changed by temperature.

The output from the temperature tracking amplifier is passed through a gain amplifier 108 and applied to the source terminal of the FET switch 114. The FET switch is driven at the same frequency as the modulator 94 through the square wave generator 128 to apply a signal to the AC to DC converter 116. This signal is then applied to the comparator 122 where it is compared against a DC reference established by the potentiometer 124. Due to the comparator 122, the output therefrom increases as the negative feedback applied to its positive input terminal decreases below a predetermined level. Conversely, the output will decrease if the negative feedback signal applied to the positive input port increases above a predetermined level. Through this circuit, the resistive element 88 tracks the output of the piezoelectric crystals 86 independent of temperature due to the temperature responsive element 90. The output level of the piezoelectric crystals 86 is independent of construction anomalies due to the adjustment available at the potentiometer 126. Accordingly, the feedback loop provides a circuit which accurately controls the amplitude of the displacement caused by the piezoelectric crystals 86 and which is independent of temperature and variations within the material used to construct these crystals.

As described above, the number of piezoelectric elements may vary depending on the number of flexure springs utilized. Further, it is not necessary to utilize a positive going strain gauge 90 to characterize the output of the resistive element 88 in the manner shown in FIG. 3. A negative going thermistor may be used in its place. Other variating and modifications will become apparent to those skilled in the art as the present invention is considered. The scope of the invention should be limited only by the following claims.

We claim:

1. A temperature compensated piezoelectric transducer drive, comprising:
    a flexure element connected between a fixed mass and a mass to be driven,
    a piezoelectric element attached to said flexure element,
    a resistive element attached to said flexure element,
    a temperature responsive element juxtaposed to said piezoelectric element and said resistive element, a power amplifier having an output for impressing a voltage across said piezoelectric element thereby causing the movement of said piezoelectric element and, in turn, the movement of said flexure element, said resistive element moving with said movement of said flexure element thereby undergoing a change of resistance, said resistive element and said temperature responsive element connected in a feedback loop about said power supply for generating a feedback signal, reference means for establishing a reference signal; and circuit means within said feedback loop for characterizing said output of said power amplifier by comparing said feedback signal against said reference signal for controlling said movement of said piezoelectric element and said flexure element.

2. A temperature compensated piezoelectric transducer as claimed in claim 1, wherein:

said piezoelectric element in a crystal,
said resistive element is a strain gauge element,
said temperature responsive element is a second strain gauge element, and
said feedback loop is a negative feedback loop.

3. A temperature compensated piezoelectric transducer as claimed in claim 1, wherein:

said flexure element is a thin, flat web joining said fixed mass to said mass to be driven in an oscillating motion,
said piezoelectric element is attached to a flat surface of one side of said flexure element,
said resistive element is attached to a flat surface of an obverse side of said flexure element, and
said temperature responsive element is attached to said fixed mass.

4. A temperature compensated piezoelectric transducer as claimed in claim 1, wherein:

a plurality of said flexure elements connect said fixed mass to said driven mass,
each of said plurality of said flexure elements has a corresponding piezoelectric element attached thereto,
only one of said plurality of said flexure elements has a corresponding resistive element attached thereto, and
only one temperature responsive element is attached to said fixed mass.

5. A temperature compensated piezoelectric transducer as claimed in claim 1, wherein:

said resistive element and said temperature responsive element are connected in a bridge configuration within said feedback loop to provide a uniform feedback signal that remains constant with temperature.

6. A temperature compensated piezoelectric transducer as claimed in claim 1, additionally comprising:

a source of AC power,
said feedback signal is an AC signal,
an AC to DC conversion circuit within said feedback loop for creating a DC feedback signal,
a comparator amplifier within said feedback loop for comparing said DC feedback signal against said reference signal and generating a correction signal, and modulating means within said feedback loop driven by said AC signal wherein said correction signal is modulated by said AC signal, and applied to said power amplifier.

7. A temperature compensated piezoelectric transducer drive for use in a ring laser gyro, comprising:

a suspension system for dithering said ring laser gyro,
driving means including piezoelectric elements for driving said suspension system,
resistive means whose resistance varies with said driving of said suspension system,
temperature responsive means whose resistance varies with temperature,
means for generating a feedback signal including said resistive means and said temperature responsive means, and
means for connecting said means for generating a feedback signal to said driving means wherein said piezoelectric elements are driven under the control of said feedback signal, the magnitude of which is established by said resistive means and adjusted for temperature by said temperature responsive means.

8. A temperature compensated piezoelectric transducer drive for use in a ring laser gyro as claimed in claim 7 wherein:

said resistive means and said temperature responsive means are connected in a bridge circuit within said means for generating a feedback signal;
said means for generating a feedback signal further includes means for generating a reference signal; and
said means for connecting said means for generating a feedback signal to said driving means includes a comparator circuit which compares said feedback signal against said reference signal to control said driving means.

9. A temperature compensated piezoelectric transducer drive for use in a ring laser gyro as claimed in claim 8, wherein:

said suspension system includes a plurality of thin, flat web members joining a fixed mass to a driven mass,
said driving means includes a plurality of said piezoelectric elements each attached to one of said thin, flat web members,
said resistive means includes a single strain gauge attached to the obverse side of one of said thin, flat web members,
said temperature responsive means includes a second strain gauge attached to said fixed mass,
said driving means further includes a power amplifier connected to said plurality of piezoelectric elements, and
said means for generating a feedback signal includes a negative feedback loop having said strain gauge and said second strain gauge connected in a bridge circuit to provide temperature compensation, the output of which is connected to said comparator circuit and compared against said reference signal and then connected to said power amplifier to control said plurality of piezoelectric elements.

* * * * *